United States Patent [19]
Puvogel

[11] Patent Number: 6,087,856
[45] Date of Patent: Jul. 11, 2000

[54] BIASING SCHEME FOR MINIMIZING OUTPUT DRIFT IN PHASE COMPARISON AND ERROR CORRECTION CIRCUITS

[75] Inventor: John M. Puvogel, Hawthorne, Calif.

[73] Assignee: Xerox Corporation, Stamford, Conn.

[21] Appl. No.: 09/200,245

[22] Filed: Nov. 25, 1998

[51] Int. Cl.[7] .................................................. G01R 25/00
[52] U.S. Cl. ................................ 327/3; 327/387; 331/17
[58] Field of Search .............................. 327/1, 2, 3, 141, 327/144, 146, 147, 148, 155–157, 233, 231, 236, 243, 244, 387; 331/17, 25, DIG. 2; 375/371–376

[56] References Cited

U.S. PATENT DOCUMENTS

| | | | |
|---|---|---|---|
| 4,450,410 | 5/1984 | Kliger et al. | 327/157 |
| 5,719,908 | 2/1998 | Greeff et al. | 375/376 |
| 5,781,036 | 7/1998 | Williams et al. | 327/2 |

*Primary Examiner*—Timothy P. Callahan
*Assistant Examiner*—Minh Nguyen
*Attorney, Agent, or Firm*—Fariba Rad

[57] ABSTRACT

A phase comparison and error correction circuit which utilizes one of a plurality of outputs of its phase detector as a biasing voltage for its error correction circuit.

2 Claims, 2 Drawing Sheets

BIASING SCHEME FOR MINIMIZING OUTPUT DRIFT IN PHASE COMPARISON AND ERROR CORRECTION CIRCUITS

BACKGROUND OF THE INVENTION

This invention relates to a phase comparison and error correction circuit, and more particularly, to a correction circuit which utilizes a biasing scheme to minimize diode leakage current, and therefore variation of the output control voltage.

Referring to FIG. 1, there is shown a prior art phase comparison and error correction circuit 10. Circuit 10 comprises an emitter-coupled logic (ECL) phase detector 12 and a correction circuit 14. The ECL phase detector 12, which is biased between ground and −5.2 volts, receives two signals $Ph_1$ and $Ph_2$. Typically, the purpose of circuit 10 is to maintain alignment (synchronization) between $Ph_1$ and $Ph_2$. However, depending on different applications, such as frequency modulation, $Ph_1$ and $Ph_2$ might lose their synchronicity.

ECL phase detector 12 is responsible for detecting whether $Ph_1$ and $Ph_2$ are out of phase, and if so which one is ahead of the other. If $Ph_1$ is ahead of $Ph_2$, the ECL phase detector 12 sends out a pulse on its error output 16 and if $Ph_2$ is ahead of $Ph_1$, the ECL phase detector 12 sends out a pulse on its error output 18. Finally, if the two signals $Ph_1$ and $Ph_2$ are in synch with each other, the ECL phase detector 12 sends out substantially equal pulses on outputs 16 and 18.

As shown on output 16, the pulse sent out by the ECL phase detector 12 is a negative pulse which has a transition from about −0.9 volts to about −1.7 volts and back to −0.9 volts. The width of the error pulse depends on how far the phases of $Ph_1$ and $Ph_2$ are from each other. Typically, the width of the error pulse is in the range of nanoseconds or picoseconds. The error pulse on output 18 has the same voltage characteristics as those of the error pulse on output 16, except it is generated only when $Ph_2$ is ahead of $Ph_1$.

Correction circuit 14, which receives an error pulse either from output 16 or output 18, generates a corresponding correction signal at the output node 20 to be used to align $Ph_1$ and $Ph_2$ signals. The outputs 16 and 18 are connected to nodes 22 and 24 of the correction circuit 14 respectively. Nodes 22 and 24 are connected to −5.2 volts through resistors $R_{11}$ and $R_{12}$ respectively. The output of Op-amp 26, the correction signal, is connected to the output node 20. The inverting input (−) of the Op-amp 26 is connected to the anode of a diode $D_{11}$ and the cathode of diode $D_{11}$ is connected to node 22 through resistor $R_{13}$. The non-inverting input (+) of the Op-amp 26 is connected to the anode of a diode $D_{12}$ and the cathode of diode $D_{12}$ is connected to node 24 through resistor $R_{14}$. The inverting input of Op-amp 26 is also connected to node 20 through a capacitor $C_{11}$ and the non-inverting input of Op-amp 26 is grounded through capacitor $C_{12}$.

In operation, nodes 22 and 24 are kept at near −0.9 volts through the outputs 16 and 18 respectively unless they receive an error pulse. In the absence of an error pulse, the inverting and non-inverting inputs of the Op-amp 26 are substantially at the same voltage.

An error pulse on output 16 causes the voltage of node 22 to drop to about −1.7 volts. The voltage of node 22 drops and causes a forward bias across $D_{11}$. This will draw current from capacitor $C_{11}$ through resistors $R_{13}$ and $R_{11}$ which causes the capacitor $C_{11}$ to discharge. As capacitor $C_{11}$ starts discharging, the voltage of the inverting input of the Op-amp 26 drops. However, the voltage of the non-inverting input of the Op-amp 26 stays constant. The lower voltage on the inverting input compared to the voltage of non-inverting input of the Op-amp 26, causes the output voltage of the Op-amp 26 to increase. Therefore, when $Ph_1$ is ahead of $Ph_2$, the voltage of the correction signal is increased. Once the error pulse ends, the voltage of node 22 returns to about −0.9 volts and $C_{11}$ will stop discharging. This will cause the value of the correction signal to stay at its new level. Typically, if no correction is required, the normal level of correction signal depends on the system in which the correction circuit is used.

A similar phenomenon happens when the output 18 delivers an error pulse to the correction circuit 14. This will cause a forward bias across diode $D_{12}$ and draws current through $R_{14}$ and $R_{12}$ which results in discharging capacitor $C_{12}$. Once capacitor $C_{12}$ starts discharging, the voltage of the non-inverting input of the Op-amp drops while the voltage of the non-inverting stays constant. This causes a voltage difference between the two inputs of the Op-amp 26 which results in lowering the correction signal. Therefore, if $Ph_2$ is ahead of $Ph_1$, the voltage of the correction signal will be lowered. The amount by which the voltage of the correction signal is lowered depends on the width of the error pulse. When the error pulse ends, the voltage of node 24 returns to about −0.9 volts and diode $D_{12}$ returns to no bias, which stops discharging capacitor $C_{12}$. As a result, the voltage of the correction signal stays at its new level.

In the absence of an error pulse, if the diodes $D_{11}$ and $D_{12}$ have any leakage current, they will cause the capacitors $C_{11}$ and $C_{12}$ to slightly charge or discharge respectively. Such leakage current will cause the voltage at the inputs of the Op-amp 26 to change and therefore change the output voltage (correction signal). This is an undesirable effect which can cause an unwanted phase change between $Ph_1$ and $Ph_2$. It should be noted that the leakage current is usually not enough to change the voltages at nodes 22 and 24. However, the charge/discharge of either capacitor $C_{11}$ or the capacitor $C_{12}$ is enough to create a voltage difference at the inputs of the Op-amp 26 and change the correction signal. This phenomenon is magnified as the temperature increases since the leakage current of diodes increases exponentially as the temperature rises.

In FIG. 1, a reference voltage $V_{REF}$ (biasing voltage) is connected to the inverting and non-inverting inputs of the Op-amp 26 through resistors $R_{14}$ and $R_{15}$ respectively. $V_{REF}$ is a −0.9 volts, temperature stable and regulated voltage which is selected to match the voltages of the outputs 16 and 18. The purpose of using a biasing voltage $V_{REF}$ is to keep the voltage of the inverting and non-inverting inputs of the Op-amp 26 at a level that minimizes leakage current in diodes $D_{11}$ and $D_{12}$. This in turn causes the output voltage of the Op-amp 26 to stay at a fixed level regardless of the leakage current unless an error pulse is generated.

This kind of bias is not effective. The problem arises due to different tolerance ranges of the different outputs of the ECL phase detector 26. Each output of the ECL phase detector 26 has a different tolerance range and each tolerance range changes as the temperature changes. Typically, a biasing voltage $V_{REF}$ is selected to be in the middle of tolerance ranges to match voltages at outputs 16 and 18. However, as the temperature changes, the tolerance ranges change, but the temperature insensitive biasing voltage stays constant. Therefore, as the temperature changes, the biasing voltage $V_{REF}$ no longer matches the voltages at the ECL outputs 16 and 18. A voltage difference between the biasing voltage $V_{REF}$ and the ECL outputs 16 and 18 causes the leakage currents to change the input voltages of the Op-amp 26.

It is an object of this invention to provide a biasing scheme to minimize the undesirable effects of diode leakage current on the phase comparison and error correction circuit and provide a substantially fixed correction signal in the absence of an error pulse.

SUMMARY OF THE INVENTION

In accordance with the present invention, there is disclosed a phase comparison and error correction circuit comprising a phase detecting means and a correction circuit. The phase detecting means has a plurality of outputs. One of the plurality of the outputs of the phase detector is utilized as a biasing output and is connected to the correction circuit to provide biasing for the correction circuit.

DESCRIPTION OF THE PREFERRED EMBODIMENT

Figure 1:
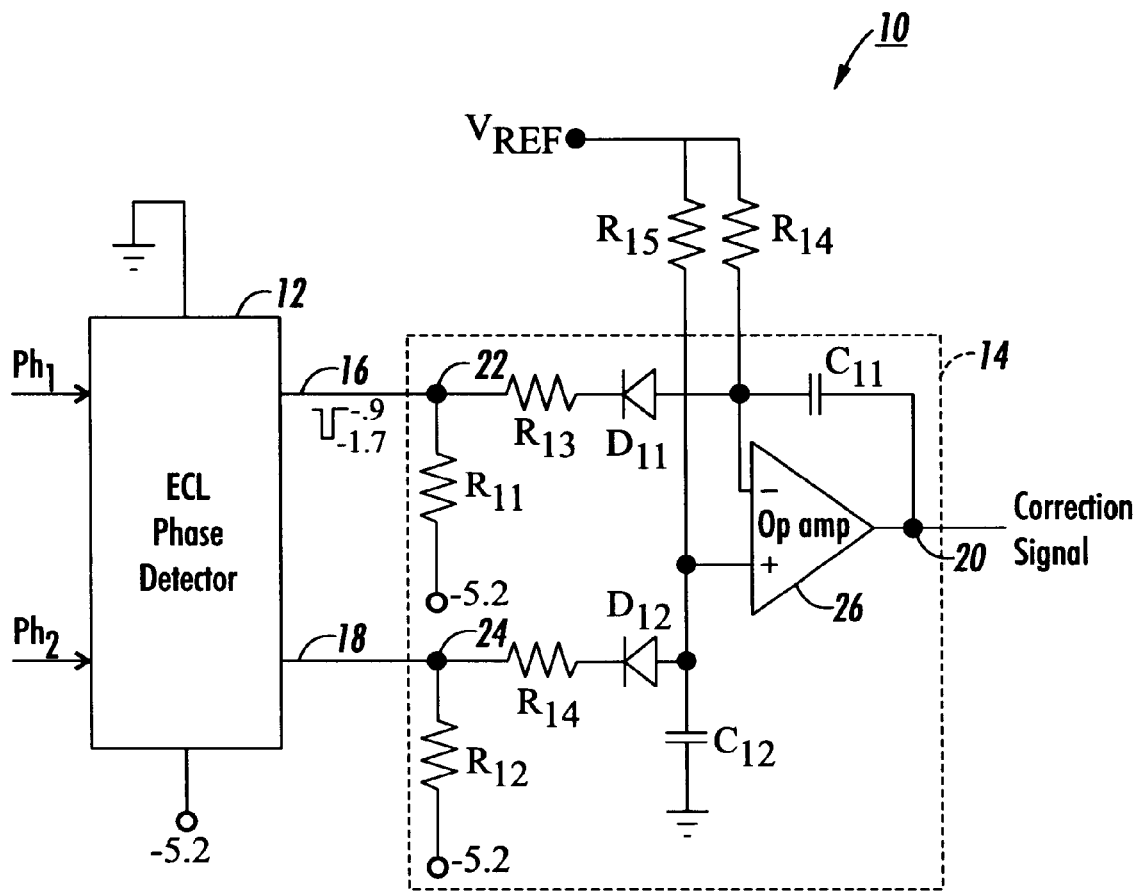
FIG. 1 shows a conventional phase comparison and error correction circuit.
Figure 2:
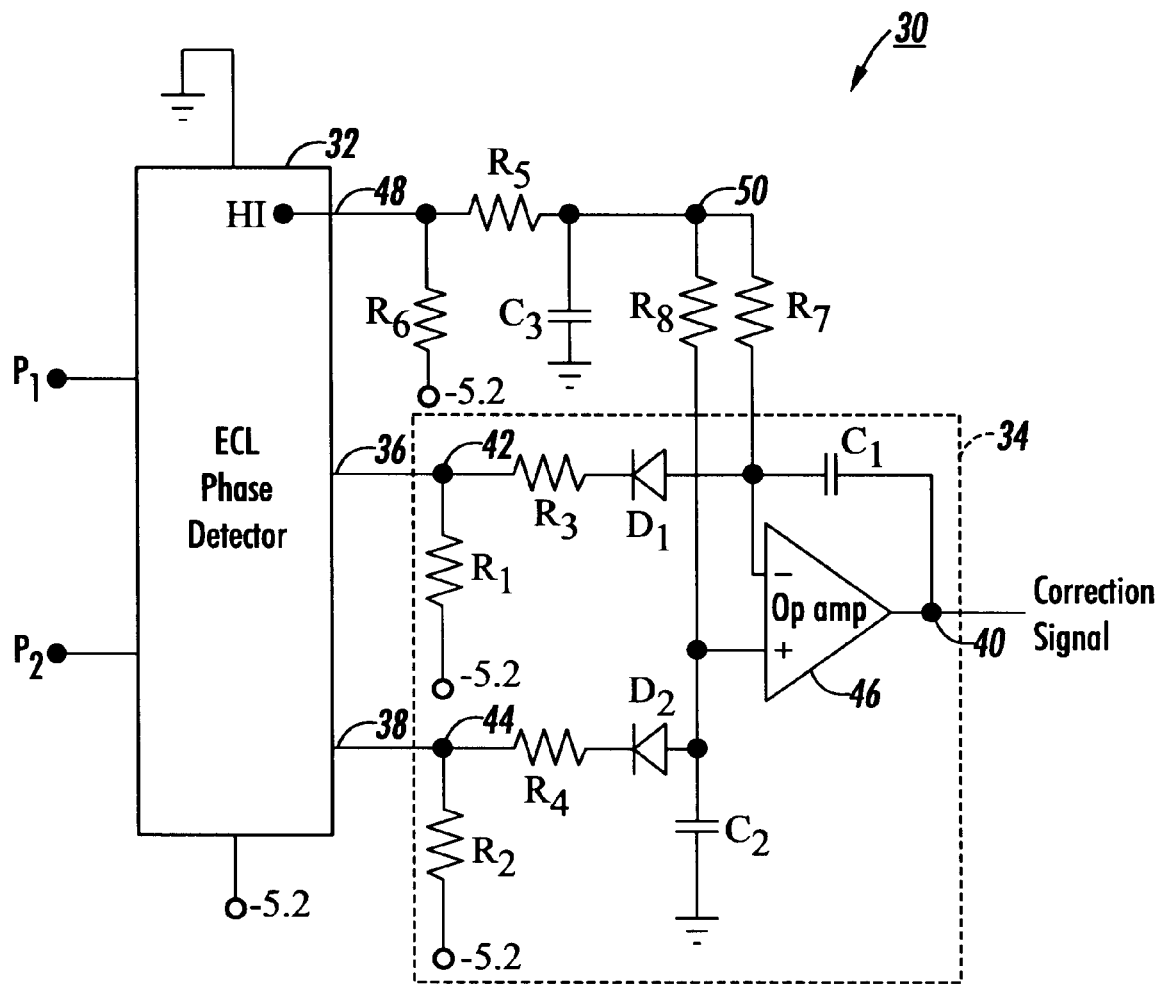
FIG. 2 shows a phase comparison and error correction circuit of this invention.

Referring to FIG. 2, there is shown a phase comparison and error correction circuit 30 of this invention. Circuit 30 comprises a well-known ECL phase detector 32 and a correction circuit 34. The ECL phase detector 32, which is biased between ground and −5.2 volts, receives two signals $P_1$ and $P_2$.

ECL phase detector 32 is responsible for detecting whether $P_1$ and $P_2$ are out of phase, and if so which one is ahead of the other. If $P_1$ is ahead of $P_2$, the ECL phase detector 32 sends out a pulse on its error output 36 and if $P_2$ is ahead of $P_1$, the ECL phase detector 32 sends out a pulse on its error output 38. Finally, if the two signals $P_1$ and $P_2$ are in synch with each other, the ECL phase detector 32 sends out substantially equal pulses on outputs 36 and 38.

Correction circuit 34, which receives an error pulse either on error output 36 or error output 38 from the phase detector 32, is responsible for generating a correction signal at the output node 40 to be used to align $P_1$ and $P_2$ signals. The outputs 36 and 38 are connected to nodes 42 and 44 of the correction circuit 34 respectively. Nodes 42 and 44 are connected to −5.2 volts through resistors $R_1$ and $R_2$ respectively. The output of Op-amp 46, which generates the correction signal, is connected to the output node 40. The inverting input(−) of the Op-amp 46 is connected to the anode of a diode $D_1$ and the cathode of diode $D_1$ is connected to node 42 through resistor $R_3$. The non-inverting input (+) of the Op-amp 46 is connected to the anode of a diode $D_2$ and the cathode of diode $D_2$ is connected to node 44 through resistor $R_4$. The inverting input of Op-amp 46 is also connected to node 40 through a capacitor $C_1$ and the non-inverting input of Op-amp 46 is grounded through capacitor $C_2$.

Typically, an ECL phase detector has multiple outputs and they usually have the same characteristics and follow the general changes within the ECL circuit. For example, if the temperature rises, the voltages of all the outputs change by the same degree. Therefore, if one of the extra outputs of the ECL is used as a biasing output, then the biasing voltage would follow the voltage changes of the outputs which generate the error pulses.

In the disclosed embodiment of this invention, output 48 of the ECL phase detector 32 is dedicated to be a biasing output. Within the ECL phase detector 32, the output 48 is a constant ECL high output (HI). Externally, the output 48 is connected to node 50 of the correction circuit 34 through resistor $R_5$. The output 48 is also connected to −5.2 volts through resistor R6. Node 50 is connected to ground through capacitor $C_3$. The inverting input of the Op-amp 46 is connected to node 50 through the resistor $R_7$ and the non-inverting input of the Op-amp 46 is connected to the node 50 through the resistor $R_8$. Resistors $R_7$ and $R_8$ have the same size.

Resistor $R_6$ is identical to resistors $R_1$ and $R_2$ to create the same load and characteristics on the output 48 as those of the outputs 36 and 38. $R_5$ and $C_3$ also create an RC circuit to filter any noise that might possibly be coupled into output 48.

In operation, in the absence of an error pulse, as the temperature changes, the biasing voltage at output 48 substantially follows and matches the voltage changes of the outputs 16 and 18. This keeps the two inputs of Op-amp 46 at a voltage which prevents leakage current in diodes $D_1$ and $D_2$. Therefore, the two inputs of Op-amp 46 stay constant and substantially minimize the undesirable variation of the correction signal due to diode leakage currents.

It should be also be noted that numerous changes in details of construction and the combination and arrangement of elements may be resorted to without departing from the true spirit and scope of the invention as hereinafter claimed.

What is claimed is:

1. A phase comparison and error correction circuit comprising:

a phase detecting means for receiving a first signal with a first phase and a second signal with a second phase;

said phase detecting means having a plurality of outputs of which at least two being error outputs;

said phase detecting means comparing said first phase and said second phase and generating a first error on one of said at least two error outputs if said first phase is ahead of said second phase or generating a second error on the other one of said two error outputs if said second phase is ahead of said first phase;

correction means being electrically connected to said at least two error outputs of said detecting means for receiving said first error or said second error and generating a correction signal;

one of said plurality of outputs of said phase detecting means being a constant output; and said constant output being electrically connected to said correction means for providing a biasing voltage.

2. The phase comparison and error correction circuit recited in claim 1, wherein said phase detecting means is an ECL device.

* * * * *